United States Patent
Iwasaki et al.

(10) Patent No.: US 6,258,698 B1
(45) Date of Patent: *Jul. 10, 2001

(54) PROCESS FOR PRODUCING SEMICONDUCTOR SUBSTRATE

(75) Inventors: Yukiko Iwasaki, Atsugi; Katsumi Nakagawa, Nara; Takao Yonehara, Atsugi; Shoji Nishida, Hiratsuka; Kiyofumi Sakaguchi, Yokohama, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/046,600

(22) Filed: Mar. 24, 1998

(30) Foreign Application Priority Data

Mar. 27, 1997 (JP) ...................................... 9-075543

(51) Int. Cl.⁷ ............................. H01L 21/30; H01L 21/46
(52) U.S. Cl. ............................. 438/455; 438/48; 438/57; 438/64
(58) Field of Search .................... 438/455, 64, 57, 438/48, 22

(56) References Cited

U.S. PATENT DOCUMENTS

| | | | |
|---|---|---|---|
| 4,116,751 | 9/1978 | Zaromb | 156/600 |
| 4,816,420 | 3/1989 | Bozler | 437/2 |
| 5,371,037 | 12/1994 | Yonehara | 437/86 |
| 5,391,257 | 2/1995 | Sullivan | 156/630 |
| 5,536,361 | 7/1996 | Kondo et al. | 156/630.1 |
| 5,665,607 * | 9/1997 | Kawama et al. | |
| 5,674,758 * | 10/1997 | McCarthy | |
| 5,811,348 | 9/1998 | Matsushita et al. | 438/455 |
| 5,856,229 | 1/1999 | Sakaguchi et al. | 438/406 |

FOREIGN PATENT DOCUMENTS

| | | |
|---|---|---|
| 0 703 609 | 3/1996 | (EP) . |
| 0 793 263 | 9/1997 | (EP) . |
| 0 797 258 | 9/1997 | (EP) . |
| 0 843 345 | 5/1998 | (EP) . |
| 0 843 346 | 5/1998 | (EP) . |
| 6-45622 | 2/1994 | (JP) . |
| 8-213645 | 8/1996 | (JP) . |
| 7-302889 | 11/1996 | (JP) . |

OTHER PUBLICATIONS

A.G. Milnes et al., "Peeled Film Technology for Solar Cells", IEEE Photovoltaic Spec. Conf., pp. 338–341 (1975).

T. Unagami, "Formation Mechanism of Porous Silicon Layer by Anodization in HF Solution", J. Electrochem. Soc., vol. 127, No. 2, pp. 476–483 (1980).

R.P. Holmstrom, "Complete dielectric isolation by highly selective and self–stopping formation of oxidized porous silicon", Appl. Phys. Lett., vol. 42, No. 4, pp. 386–388 (1983).

Patent Abstracts of Japan, vol. 096, No. 012, Dec. 26, 1996 (corresponding to JP 08–213645).

* cited by examiner

Primary Examiner—Kevin M. Picardat
Assistant Examiner—D. M. Collins
(74) Attorney, Agent, or Firm—Fitzpatrick, Cella, Harper & Scinto

(57) ABSTRACT

A process for producing a semiconductor substrate is provided which comprises a first step of anodizing a surface of a first substrate to form a porous layer on the surface, a second step of simultaneously forming a semiconductor layer on the surface of the porous layer and a semiconductor layer on a surface of the first substrate on its side opposite to the porous layer side, a third step of bonding the surface of the semiconductor layer formed on the surface of the porous layer to a surface of a second substrate, and a fourth step of separating the first substrate and the second substrate at the part of the porous layer to transfer to the second substrate the semiconductor layer formed on the surface of the porous layer, thereby providing the semiconductor layer on the surface of the second substrate. This makes it possible to produce semiconductor substrates at a low cost while making good use of expensive substrate materials.

22 Claims, 9 Drawing Sheets

PROCESS FOR PRODUCING SEMICONDUCTOR SUBSTRATE

BACKGROUND OF THE INVENTION

1. Field of the Invention

This invention relates to a process for producing a semiconductor substrate, and more particularly to a process for producing semiconductor substrates which are low-cost substrates having thin film crystal layers formed thereon and preferably suitable for use especially as substrates for solar cells.

2. Related Background Art

As drive energy sources for various instruments or as power sources systematically connected with commercial electric power, solar cells have already been widely studied and developed. In the fabrication of such solar cells, because of a demand for lower cost it is sought to form semiconductor devices on substrates which are as low as possible in cost.

Meanwhile, as semiconductors constituting the solar cells, silicon is commonly used. In particular, from the viewpoint of the efficiency of converting light energy into photovoltaic force (i.e., photoelectric conversion efficiency), single crystal silicon is the best. However, from the viewpoint of achieving large area and low cost, amorphous silicon is considered advantageous.

In recent years, for the purposes of cost reduction comparable to amorphous silicon and high photoelectric conversion efficiency comparable to single crystals, use of polycrystalline silicon has been studied.

However, in such single crystal silicon and polycrystalline silicon, processes conventionally proposed require slicing bulk crystals into plate-like substrates, and hence it has been difficult for them to have a thickness of 0.3 mm or smaller. Thus, the substrates obtained by slicing bulk crystals in this way consequently have a larger thickness than is necessary for absorbing light in a sufficient amount and can not be said to be completely effectively utilized as substrate materials. Namely, in order to make semiconductor devices such as solar cells lower in cost, the substrate must be made much thinner.

Recently, a method has been proposed in which a silicon sheet is formed by a spin process carried out by casting droplets of molten silicon into a mold. The substrates thus obtained, however, are about 0.1 mm to about 0.2 mm thick at the smallest and are still not sufficiently thin, compared with the thickness (20 $\mu$m to 50 $\mu$m) required for the absorption of light.

Under such circumstances, an attempt has been proposed in which thin film epitaxial layers grown on single crystal silicon substrates are separated (peeled) from the substrates, and the peeled films are used in solar cells so that a high photoelectric conversion efficiency and a low cost can be achieved (Milnes, A. G. and Feucht, D. L., "Peeled Film Technology Solar Cells", IEEE Photovoltaic Specialist Conference, p.338, 1975).

In this method, however, an intermediate SiGe layer must be put between the substrate of single crystal silicon and the growing epitaxial layer, followed by heteroepitaxial growth in that state, and further the grown layer must be peeled by selectively fusing this intermediate layer. In general, in the heteroepitaxial growth, a difference in lattice constant tends to cause defects or imperfections at growth boundaries. Also, in view of the use of different kinds of materials, this can not be said to be advantageous in process cost.

Thin, crystal solar cells are also obtained by a process disclosed in U.S. Pat. No. 4,816,420, i.e., a solar-cell fabrication process characterized by forming a sheet-like crystal by selective epitaxial growth, or lateral growth carried out on a crystal substrate through a mask material, and thereafter separating the resultant crystal from the substrate.

In this process, however, openings provided in the mask material are line-shaped. In order to separate the sheet-like crystal grown from the line seeds by selective epitaxial growth or by lateral growth, the cleavage of crystals is utilized to mechanically peel it. Hence, if the line seeds are larger than a certain size, they come in contact with the substrate in so large an area that the sheet-like crystal may be broken when it is peeled.

Especially when solar cells are made to have large area, however narrow width the line seeds have (about 1 $\mu$m in practice), it is difficult in practice to obtain the desired semiconductor substrate if they have a line is length of several mm to several cm or a size larger than that.

Under such circumstances, it has been proposed to form a porous silicon layer on the surface of a silicon wafer by anodization, thereafter separate it from the wafer surface, fix the separated porous layer onto a metal substrate, form an epitaxial layer on the porous layer, and, using the epitaxial layer thus formed, produce a thin film crystal solar cell that exhibits good characteristics (see Japanese Patent Application Laid-Open No. 6-45622).

Japanese Patent Application Laid-open No. 8-213645 also discloses that a porous silicon layer is formed on a silicon wafer, a thin film silicon layer is grown on the porous layer, and thereafter the grown thin film silicon layer and the silicon wafer are separated from the porous silicon layer so as for the former to be used to form a solar cell. Also, residue of the porous silicon layer is removed from the silicon wafer from which the thin film silicon layer has been separated, and thereafter the resultant silicon wafer is reused so as to achieve a cost reduction.

In these processes, however, the thickness of the silicon wafer decreases with an increase in times of reuse. Thus the silicon wafer becomes difficult to handle, and there is a limit to the times of reuse. Hence, in this case too, it is difficult to say that the materials are effectively utilized.

SUMMARY OF THE INVENTION

The present invention was made taking account of the above circumstances. Accordingly, an object of the present invention is to provide a process by which a semiconductor substrate having characteristics good enough to constitute a thin film crystal solar cell can be produced at a low cost while making good use of materials.

The present invention provides a process for producing a semiconductor substrate, comprising a first step of anodizing a surface of a first substrate to form a porous layer on the surface; a second step of simultaneously forming a semiconductor layer on the surface of the porous layer and a semiconductor layer on a surface of the first substrate on its side opposite to the porous layer side: a third step of bonding the surface of the semiconductor layer formed on the surface of the porous layer to a surface of a second substrate; and a fourth step of separating the first substrate and the second substrate at the part of the porous layer to transfer to the second substrate the semiconductor layer formed on the surface of the porous layer, thereby providing the semiconductor layer on the surface of the second substrate.

The present invention also provides a process for producing a semiconductor substrate, comprising:

a first routine comprising a first step of anodizing a surface of a first substrate to form a porous layer on the surface; a second step of simultaneously forming a semiconductor layer on the surface of the porous layer and a semiconductor layer on a surface of the first substrate on its side opposite to the porous layer side; a third step of bonding the surface of the semiconductor layer formed on the surface of the porous layer to a surface of a second substrate; a fourth step of separating the first substrate and the second substrate at the part of the porous layer to transfer to the second substrate the semiconductor layer formed on the surface of the porous layer; and a fifth step of removing a residue of the porous layer left on the surface of the first substrate as a result of the separation; and a second routine comprising a first step of anodizing a surface of a first substrate to form a porous layer on the surface; a second step of forming a semiconductor layer only on the surface of the porous layer; a third step of bonding the surface of the semiconductor layer formed on the surface of the porous layer to a surface of a second substrate; a fourth step of separating the first substrate and the second substrate at the part of the porous layer to transfer to the second substrate the semiconductor layer formed on the surface of the porous layer; and a fifth step of removing a residue of the porous layer left on the surface of the first substrate as a result of the separation;

the first and second routines being repeated at least once to provide the semiconductor layers on the surfaces of a plurality of second substrates by use of the same first substrate.

The present invention further provides a process for producing a semiconductor substrate comprising a first step of anodizing a surface of a first substrate to form a porous layer on the surface; a second step of simultaneously forming a semiconductor layer on the surface of the porous layer and a semiconductor layer on a surface of the first substrate on its side opposite to the porous layer side; a third step of fixing the surface of the semiconductor layer formed on the surface of the porous layer and a surface of a provisional substrate; a fourth step of separating the first substrate and the semiconductor layer formed on the surface of the porous layer at the part of the porous layer to make the provisional substrate hold the semiconductor layer formed on the surface of the porous layer; and a fifth step of transferring from the provisional substrate to a second substrate the semiconductor layer held on the provisional substrate, thereby providing the semiconductor layer on the surface of the second substrate.

The present invention still further provides a process for producing a semiconductor substrate, comprising:

a first routine comprising a first step of anodizing a surface of a first substrate to form a porous layer on the surface; a second step of simultaneously forming a semiconductor layer on the surface of the porous layer and a semiconductor layer on a surface of the first substrate on its side opposite to the porous layer side; a third step of fixing the surface of the semiconductor layer formed on the surface of the porous layer and a surface of a provisional substrate; a fourth step of separating the first substrate and the semiconductor layer formed on the surface of the porous layer at the part of the porous layer to make the provisional substrate hold the semiconductor layer formed on the surface of the porous layer; a fifth step of transferring from the provisional substrate to a second substrate the semiconductor layer held on the provisional substrate; and a sixth step of removing a residue of the porous layer left on the surface of the first substrate as a result of the separation; and a second routine comprising a first step of anodizing a surface of a first substrate to form a porous layer on the surface; a second step of forming a semiconductor layer only on the surface of the porous layer; a third step of fixing the surface of the semiconductor layer formed on the surface of the porous layer and a surface of a provisional substrate; a fourth step of separating the first substrate and the semiconductor layer-formed on the surface of the porous layer at the part of the porous layer to make the provisional substrate hold the semiconductor layer formed on the surface of the porous layer; a fifth step of transferring from the provisional substrate to a second substrate the semiconductor layer held on the provisional substrate; and a sixth step of removing a residue of the porous layer left on the surface of the first substrate as a result of the separation;

the first and second routines being repeated at least once to provide the semiconductor layers on the surfaces of a plurality of second substrates by use of the same first substrate.

DESCRIPTION OF THE PREFERRED EMBODIMENTS

As an embodiment of the present invention, the process for producing a semiconductor substrate, which is used for solar cells, will be specifically described below ith reference to FIGS. 1A to 1H, using a silicon wafer s an example of the first substrate. Impurities are incorporated into the surface portion of a crystal substrate, e.g., a single crystal silicon wafer 101 by thermal diffusion, ion implantation, or by mixing them when wafers are manufactured. Thus, at least a p+-type (or n+-type) layer 102 is formed on the wafer surface (see FIG. 1A).

Figure 1A:
FIGS. 1A, 1B, 1C, 1D, 1E, 1F, 1G and 1H are a flow sheet diagrammatically illustrating an example of the process for producing a semiconductor substrate according to the present invention.
Figure 1B:
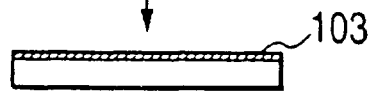
Figure 1C:
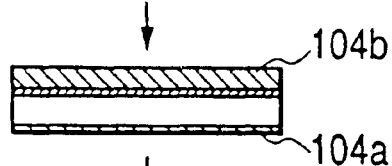
Figure 1D:
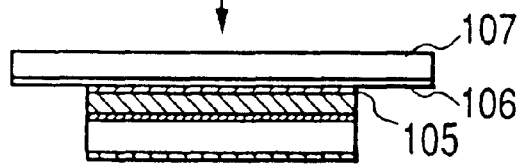

Next, the wafer surface on its side where the impurities have been incorporated is anodized in, e.g., an HF (hydrofluoric acid) solution, whereby the surface and its vicinity are made porous to form a porous layer 103 (see FIG. 1B). Then, on the surface of the porous layer 103 and on the surface of the silicon wafer 101 on its side opposite to the porous layer, single crystal silicon layers 104b and 104a are respectively grown by epitaxial growth in a liquid phase (see FIG. 1C).

At this stage, when the wafer surface is made porous by anodization, the level of anodizing electric currents may be changed from a low level to a high level during the treatment so that the porous layer can be previously provided with a density-gradient structure. This makes it easy for the single crystal silicon layer 104b to be separated from the silicon wafer 101 at the part of the porous layer 103 after the epitaxial growth.

On the silicon film (single crystal silicon layer) 104b formed on the porous layer 103, a p+-type (or n+-type n'-type) layer 105 is further formed. Thereafter, a second substrate 107 is bonded to the p+-type (or n+ -type) layer 105 via an adhesive or the like after a back electrode 106 has been formed on the p+-type (or n+-type) layer 105, or it is bonded to the p'-type (or n'-type) layer 105 after the back electrode 106 has been formed on the second substrate 107 (see FIG. 1D).

Figure 1E:
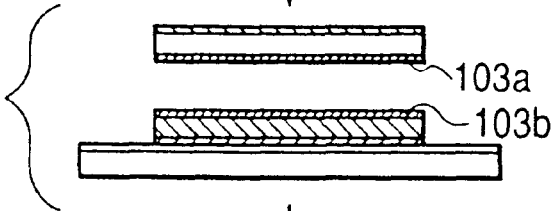
Figure 1F:
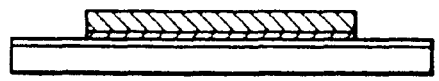
Figure 1G:
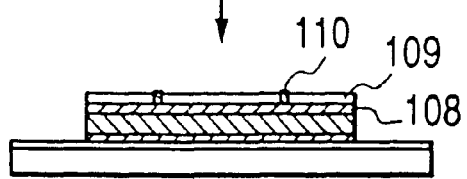
Figure 1H:

Next, a physical force (e.g., a direct force such as mechanical force or an indirect force acting through some medium) is caused to act between this second substrate 107 and the silicon wafer 101 to divide the porous layer 103 up and down, so that the single crystal silicon layer 104b is separated from the silicon wafer 101 and is transferred onto the second substrate 107 (see FIG. 1E). After it has been transferred, the porous layer 103b left on the surface of the single crystal silicon layer 104b is removed by etching, and thereafter a p+-type (or n+-type) layer 108 is formed, and a transparent conductive layer 109 and a collector electrode 110 are further formed thereon to form a solar cell (see FIGS. 1F and 1G).

The silicon wafer 101 from which the second substrate has been separated is, after the porous layer 103a left on its surface is removed and treated by etching or the like (see FIG. 1H), again used in the initial step (see FIG. 1A). In this way, although the above steps (see FIGS. 1A to 1H) are repeated, the thickness of the silicon wafer 101 is kept constant because of the addition of the single crystal silicon layer 104a in a thickness, e.g., corresponding to the thickness lost in one process. Hence the silicon wafer 101 can be handled during the process with greater ease and can be effectively utilized.

The semiconductor layer grown on the silicon wafer (first substrate) 101 on its side opposite to the side on which the porous layer 103a is present is successively replaced by the material constituting the first substrate. This may be dissolved into a solvent after the silicon wafer has been used up, whereby it can be reused as a dissolution material for the liquid phase growth.

Points or features of the process for producing the substrate for solar cells according to the present invention will be described below in detail. First, the porous layer 103 will be detailed below, using a silicon wafer as an example of the first substrate 101.

In the anodization carried out to form the porous silicon layer 103, a hydrofluoric acid (hereinafter often "HF") solution is preferably used. A solution of hydrochloric acid or sulfuric acid may also be used. When the hydrofluoric acid solution is used, the p+-type (or n+-type) layer 102 can be made porous at an HF concentration of 10% or more. Quantity of electric currents flowed at the time of anodization may be appropriately determined depending on the layer thickness of the porous layer 103, the surface state of the porous layer 103 or the like. Stated approximately, it is suitable for the electric currents to be in the range of from 1 mA/cm$^2$ to 100 mA/cm$^2$.

To the HF solution, an alcohol such as ethyl alcohol may be added, whereby air bubbles of reaction gases produced at the time of anodization can be removed instantaneously from the surface of the reaction system without stirring, and the porous silicon (porous layer) can be formed uniformly and efficiently. Quantity of the alcohol to be added may be appropriately determined similarly depending on the HF concentration, the desired layer thickness of the porous layer or the surface state of the porous layer. It must be so determined as not to result in an excessively low HF concentration.

The single crystal silicon has a density of 2.33 g/cm$^3$, where the density of the porous silicon layer can be changed in the range of from 1.1 to 0.6 cm$^3$, by changing the concentration of the HF solution in the range of from 50$ to 20%. The porous layer may also be changed in its porosity by changing the electric currents for the anodization. For example, the porosity increases with an increase in electric currents.

Mechanical strength of the porous silicon may differ depending on the porosity and is considered sufficiently weaker than that of bulk silicon. For example, when the porous silicon has a porosity of 50%, its mechanical strength may be considered half that of the bulk silicon. If a sufficient adhesion is imparted to the interface between the porous layer and the substrate when the substrate is bonded to the surface of the porous silicon, a compression force, a tensile force, a shear force or ultrasonic waves may be applied between the silicon wafer having the porous layer and the substrate, whereby the porous silicon layer can be broken. The porous layer can be broken at a weaker force when its porosity is increased.

In usual instances, in order to form the porous silicon by anodization, positive holes are required for anodization. Accordingly, p-type silicon in which positive holes are mainly present is conventionally used to make it porous (T. Unagami, J. Electrochem. Soc., vol.127, p.476, 1980). On the other hand, it is also reported that silicon can be made porous so long as it is a low-resistance n-type silicon (R.P. Holmstromand, J. Y. Chi, Appl. Phys. Lett., vol.42, p.386, 1983). Thus, the silicon can be made porous when a low-resistance silicon n-type is used without regard to p-type or n-type. The silicon can also be made porous selectively in accordance with its conductivity type. For example, as in FIPOS (Full Isolation by Porous Oxidized Silicon) process, the anodization may be carried out in the dark to make only the p-type layer porous.

In the porous silicon obtained by anodizing the single crystal silicon, holes with a diameter of several nm or so are formed, as can be observed using a transmission electron microscope, and have a density which is half or less of the density of the single crystal silicon. Nevertheless, its single-crystallinity is maintained, and hence the epitaxial layer can be grown on the porous silicon by heat-assisted CVD (Chemical Vapor Deposition) or the like.

The porous layer has voids in a large quantity which are formed in its interior, and hence the layer has dramatically increased its surface area compared with its volume, so that it can be chemically etched at a greater rate than instances where single crystal layers are etched. Also, polycrystalline silicon may be used in place of the single crystal silicon, where the porous layer can be formed by anodization. The crystal silicon layer can be formed thereon by thermal CVD or the like. In this instance, it is possible to carry out partial epitaxial growth corresponding to the size of crystal grains of the polycrystalline silicon.

A liquid phase growth process and a vapor phase growth process which are suitable for the formation of the thin film semiconductor layers (single crystal silicon layer) 104b and 104a will be described below.

Figure 2:
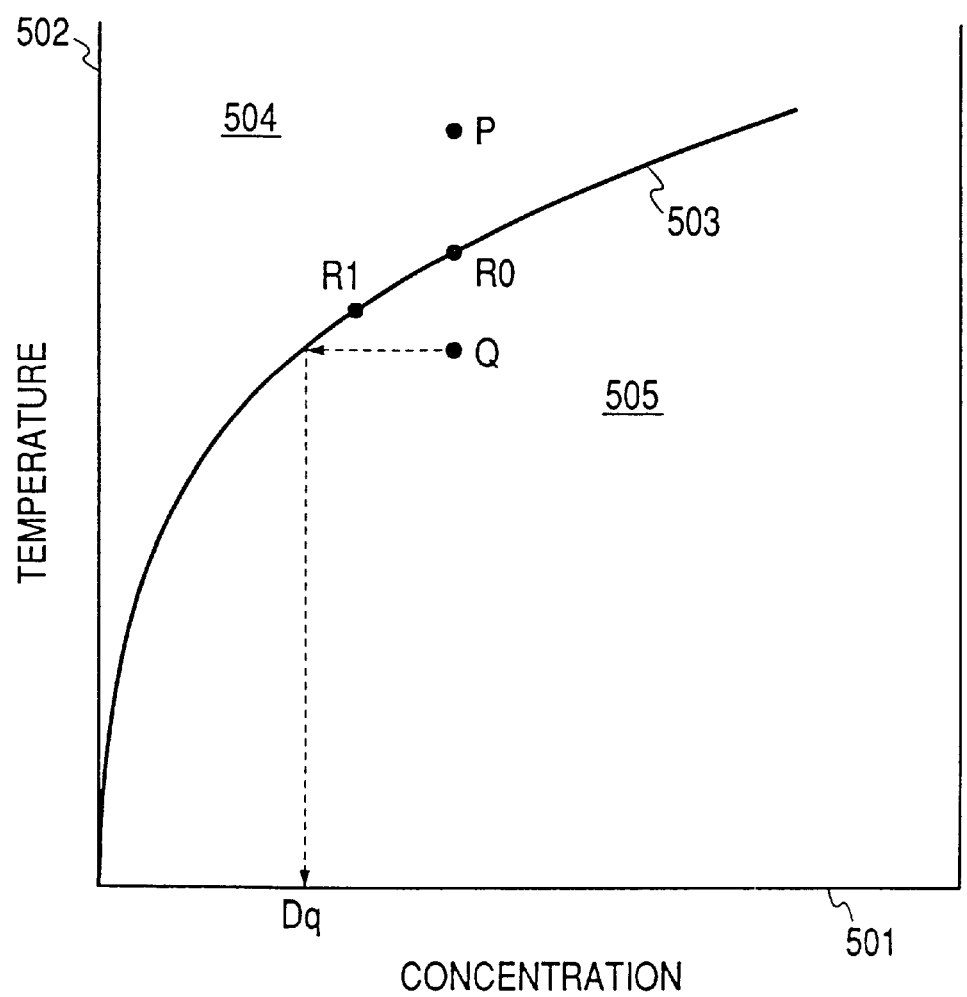
FIG. 2 is a graph diagrammatically illustrating the principle of liquid phase growth.

FIG. 2 is a correlation diagram used to explain the liquid phase growth, which is in a state thermally equilibrated between a solvent M (e.g., indium) and a solute S (e.g., silicon). Here, abscissa 501 indicates average concentration of the solute S in a solution, which shows that the solvent is pure solvent at the left end and the solute S increases in concentration toward the right. Ordinate 502 indicates temperature of the solution, where the temperature becomes higher toward the top. The state of solution is roughly divided into two regions 504 and 505 along a curve 503 that forms a boundary. In the region 504 and, e.g., at P, the solute S is uniformly dissolved in the solvent M, and its concentration is in agreement with the concentration indicated on the abscissa.

In the region 505, the solute S has partly solidified to become deposited. For example, at Q, a solid S and a solution with a concentration Dq are present together. Also, in a solution standing at R0 on the curve 503, a substrate prepared using a material that does not dissolve at this temperature is immersed, where, as the temperature of the solution is slowly lowered, the concentration of the solute S in the solution decreases along the curve 503 to, e.g., R1. Then, the solute S corresponding to the difference in concentration between R0 and R1 is deposited as a solid on the surface of the substrate.

Especially when the first substrate is crystalline, the solid S may also take over the crystallinity of the substrate to become crystalline. Such crystal growth is called epitaxial growth. Usually, when the material of the substrate is identical with the solid S, the epitaxial growth most readily takes place. However, even when they are heterogeneous, the epitaxial growth is possible (i.e., heteroepitaxial growth). Thus, the thin film semiconductor layer can be grown on the surface of the crystalline first substrate.

In usual instances, the solution is brought into a just saturated state or in a slightly unsaturated state, where the first substrate is immersed therein and, after lapse of some time, the solution is adjusted to a saturated state to start crystal growth. By doing so, any impurities or defects in the surface portion of the substrate are removed by the effect of thermal equilibrium, and a crystal with a high quality can be grown with ease, as so considered.

As for the vapor phase growth, thermal CVD, LPCVD (Low Pressure CVD), sputtering, plasma enhanced CVD and photo-assisted CVD are available. Starting gases used for the growth of single crystal silicon typically include silanes such as $Si_2H_2Cl_2$, $SiCl_4$, $SiHCl_3$, $SiH_4$, $Si_2H_6$, $SiH_2F_2$ and $Si_2F_6$, and halogenated silanes. As a carrier gas or for the purpose of providing a reducing atmosphere for accelerating the crystal growth, $H_2$ is added to the above starting gases. The proportion of the starting gases to the $H_2$ may be appropriately determined depending on the growth process, the type of starting gases and also the growth conditions. Preferably, both may be in a proportion of from 1:1,000 to 1:10, and more preferably from 1:800 to 1:20 (ratio of flow rate).

In the case where a compound semiconductor is formed, MOCVD (Metal Organic CVD) and MBE (Molecular Beam Epitaxy) are available. As starting gases used in such crystal growth, when, e.g., GaAs is grown, $Ga(CH_3)_3$, $AsH_3$, $Al(CH_3)_3$, etc. are used in the MOCVD. As to temperature at the time of growth, when silicon is grown by thermal CVD, the temperature may preferably be controlled to be approximately from 800° C. to 1,250° C., and more preferably from 850° C. to 1,200° C. When GaAs is grown by MOCVD, the temperature may preferably be controlled to be from 650° C. to 900° C. In the plasma enhanced CVD, the temperature may preferably be controlled to be from about 200° C. to about 600° C., and more preferably from 200° C. to 500° C.

Similarly, as to pressure, the vapor phase processes other than the MBE may preferably be carried out at a pressure of approximately from $10^{-2}$ Torr to 760 Torr, and more preferably from $10^{-1}$ Torr to 760 Torr. The process using MBE may preferably be carried out at a pressure of $10^{-5}$ Torr or below, and more preferably $10^{-6}$ Torr or below, as back pressure.

(Experiment 1)

FIGS. 3A to 3F illustrate a production process. The present Experiment will be described below in accordance with this process.

Figure 3A:
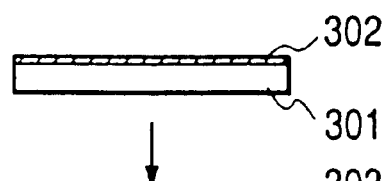
FIGS. 3A, 3B, 3C, 3D, 3E and 3F are a flow sheet diagrammatically illustrating a process for producing a semiconductor substrate carried out in Experiment 1.
Figure 3B:
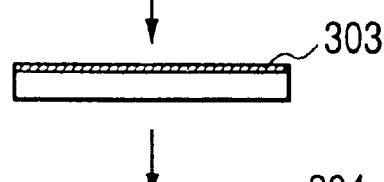
Figure 3C:
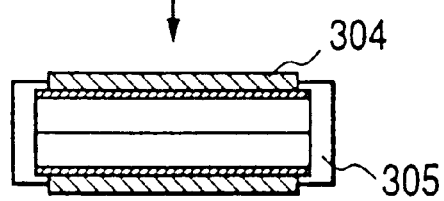

First, B (boron) was incorporated into the surface layer of a p-type single crystal silicon substrate 301 800 $\mu$m thick and 4 inches diagonal by thermal diffusion to form a surface layer 302 (see FIG. 3A). This single crystal substrate whose surface layer 302 had been made into $p^+$-type was anodized in an HF solution to form a porous layer 303 of about 10 $\mu$m thick (see FIG. 3B).

Next, the p-type single crystal substrate 301 on which the porous layer 303 had been formed was annealed at a surface temperature of 1,050° C. for 10 minutes in an atmosphere of hydrogen, and thereafter immersed in a 900° C. metal indium solvent into which silicon was melted until it was in a concentration high enough to become super-saturated, followed by slow cooling to form a silicon layer 304 in a thickness of 30 $\mu$m. Here, in order for the silicon layer 304 to be formed only on the surface of the porous layer, two substrates were superposed in such a way that their back surfaces came in face-to-face contact, in the state of which they were fitted to a jig 305 so as to be covered with it except the necessary areas (see FIG. 3C). In this instance, the solution was not stirred during the course of the growth.

Figure 3D:
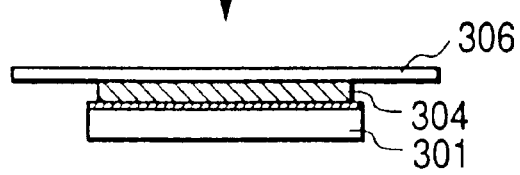
Figure 3E:
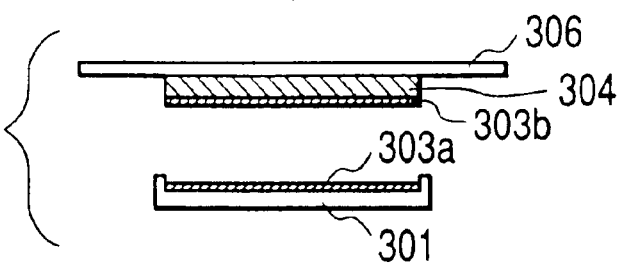
Figure 3F:

Next, the jig 305 was removed to separate the two substrates, and also, a tape 306 having a strong adhesion was stuck to the substrate 301 on its side where the silicon layer 304 was formed (see FIG. 3D). Then, a force was caused to act between the tape 306 and the single crystal silicon substrate 301 in the direction where they were pulled apart from each other. Thus, they were separated at the part of the porous layer 303 (see FIG. 3E). As the result, a porous layer 303a was left on the substrate 301 and a porous layer 303b on the silicon layer 304.

The porous layer 303a left on the single crystal silicon from which the liquid phase grown film (silicon layer) 304 had been separated was removed. Here, only the porous silicon can be selectively removed by electroless wet-process chemical etching, using at least one of a conventional silicon etchant and selective etchants for porous silicon, i.e., hydrofluoric acid or a mixture of hydrofluoric acid and at least one of alcohol and hydrogen peroxide solution added thereto, and buffered hydrofluoric acid or a mixture of buffered hydrofluoric acid and at least one of alcohol and hydrogen peroxide solution added thereto. In the present Experiment, a mixture of hydrofluoric acid and hydrogen peroxide solution added thereto was used.

As described above in detail, only the porous silicon can be etched away. When, however, its surface is too rough to have a tolerable surface flatness, the above treatment may optionally be followed by surface smoothing (see FIG. 3F), and thereafter the single crystal silicon substrate 301 is subjected to the step shown in FIG. 3A.

In the experiment, the above process was repeatedly carried out 50 times. At the time the 50 operations were completed, the single crystal substrate was in a thickness of about 290 μm, and it became fairly difficult to attach the jig at the time of liquid phase growth or to handle film separation.

(Experiment 2)

Figure 4:
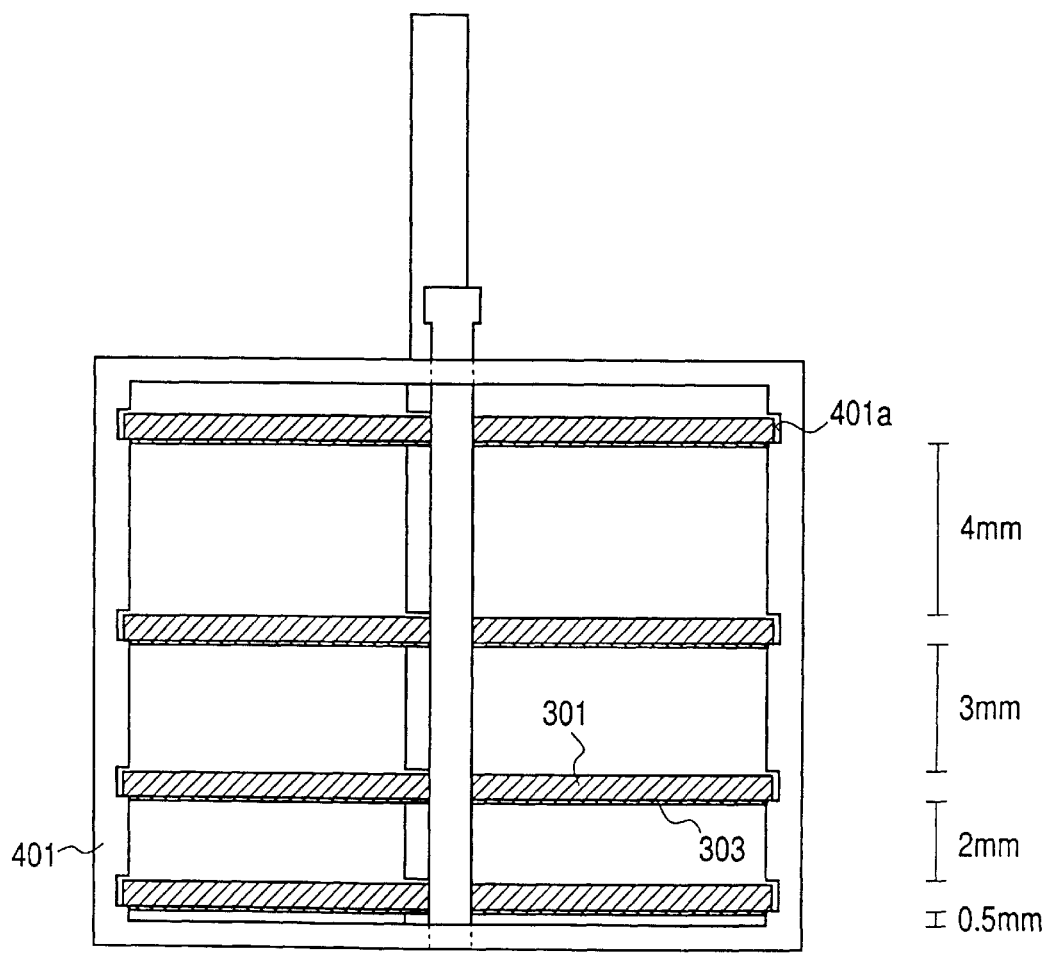
FIG. 4 is a schematic plan view diagrammatically illustrating a substrate holder used in liquid phase growth to examine the relationship between substrate distance and layer thickness in Experiment 2.

A substrate holder 401 as shown in FIG. 4 was prepared, having different distances between fixing portions. In the same manner as in Experiment 1 but after the single crystal silicon substrate 301 on which the porous layer 303 had been formed was set in each fixing portion 401a of the substrate holder, this was immersed in the indium solvent into which silicon was melted until it became super-saturated, followed by slow cooling, to carry out liquid phase growth without stirring the solution during the course of growth.

Figure 5:
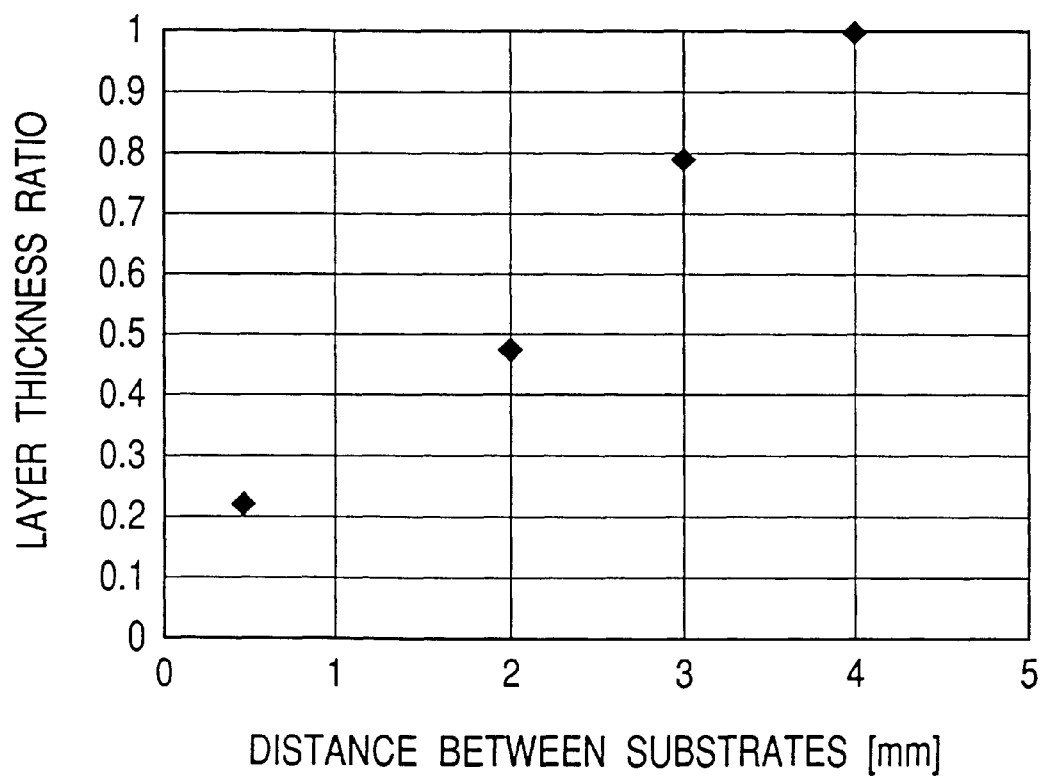
FIG. 5 is a graph showing the relationship between substrate distance and layer thickness obtained in Experiment 2.

FIG. 5 shows the relationship between silicon layer thickness obtained after slow cooling for 20 minutes and mutual distance of substrates 301. Here, the thickness of a film having been deposited after slow cooling for 20 minutes on the surface of porous layer 303 of a substrate set at a maximum mutual distance of 4 mm is 1, the thickness of films deposited at other substrate distances is indicated as the former's ratio to the latter.

As can be seen from this experiment, properly setting the distance between substrates makes it possible to grow silicon films with a variety of layer thicknesses in the course of liquid phase growth carried out. This is presumably because, when the solution is not stirred, the layer thickness depends on the quantity of silicon in the solution present between substrates 301.

(Experiment 3)

Figure 6:
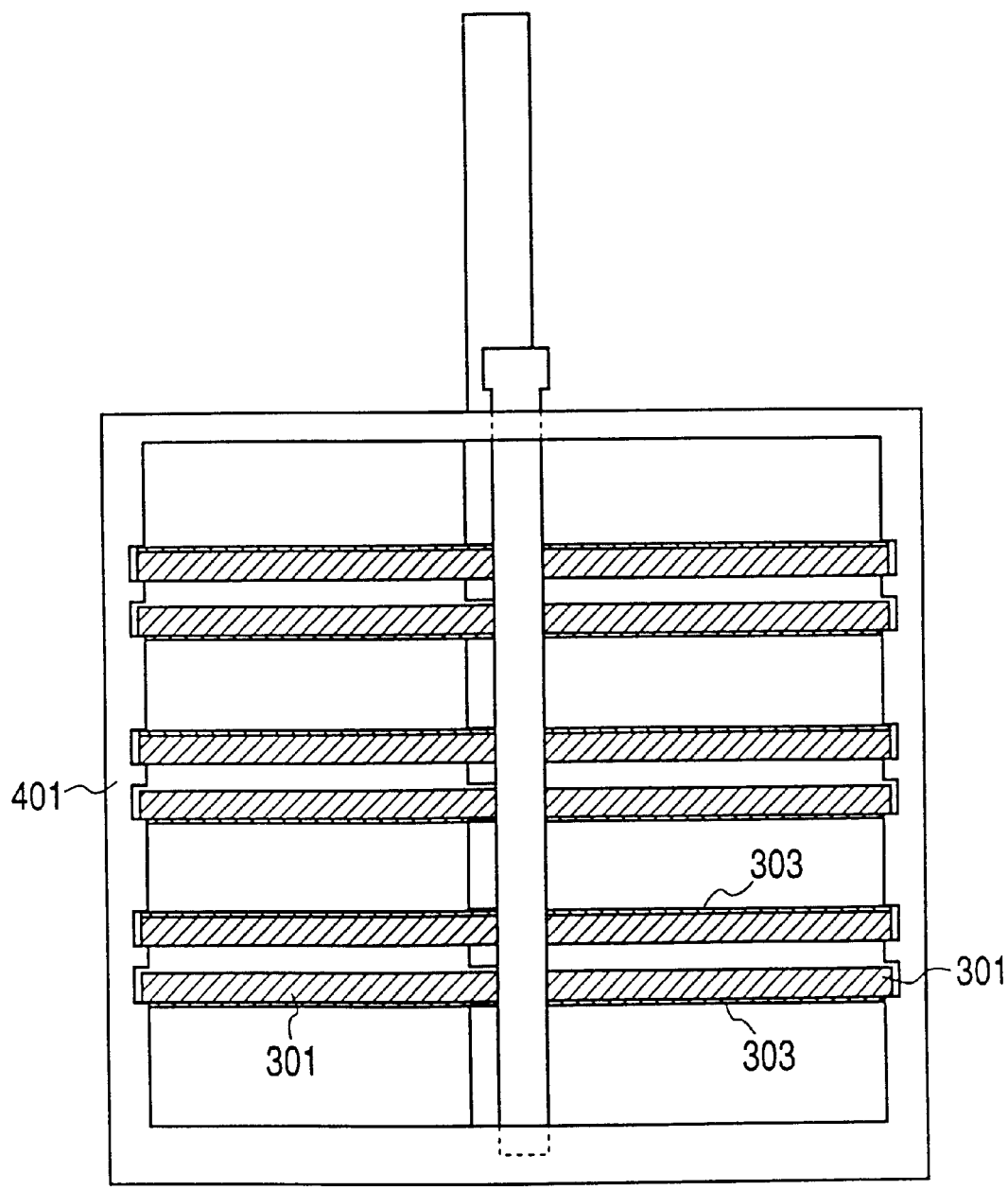
FIG. 6 is a schematic plan view diagrammatically illustrating a substrate holder for liquid phase growth used in Experiment 3 to deposit films with different thickness on both sides of one substrate.

The procedure of Experiment 1 was repeated 100 times on the like single crystal silicon substrate except that the silicon layer 304 was formed by the liquid phase growth not only on the porous layer 303 of the p-type single crystal silicon substrate 301 but also on its opposite side simultaneously. In the growth of silicon 30 layers on the both sides of the substrate, as shown in FIG. 6, the p-type single crystal silicon substrate 301 was set in each fixing portion of a substrate holder 401 prepared in accordance with the results in Experiment 2. As the result, the growth was controllable so as to be in a thickness of 30 μm on the porous layer 303 and, on the opposite side, in a thickness of 10 μm corresponding to the thickness lost in one process, so that it was possible to keep constant the thickness of each p-type single crystal silicon substrate 301. Since the thickness of the p-type single crystal silicon substrate 301 was kept constant as described above, the 100 repetitions of the process as shown in FIGS. 3A to 3F did not cause any problem with respect to handling and enabled full utilization of the p-type single crystal silicon substrate 301.

No problem occurred in the FIGS. 3A–3F process even after the liquid phase grown silicon was repeatedly superposed on the side opposite to the porous layer 303 side until the substrate 301 was completely replaced.

As can be seen from the above Experiments, in the present invention, the porous layer is formed on the silicon substrate, the silicon layers are formed on both sides of the silicon substrate, and thereafter the silicon layer epitaxially grown on the porous layer 303 is separated from the silicon substrate. In this way, semiconductor substrates and also thin film crystal solar cells are produced.

More specifically, the present invention is characterized in that the utilization of the epitaxial layer on the porous layer makes it possible to attain characteristics equivalent to those of epitaxial layers directly formed on wafers, that the simultaneous growth of epitaxial layers on the both sides of the silicon substrate makes it possible to keep the substrate thickness constant and that substantially all the silicon substrate present from the beginning can be utilized to achieve an advantage of low cost. Moreover, in the present invention, compound semiconductor layers can also be formed on the porous layers, and there is also an advantage that more efficient solar cells can be obtained.

In the solar cell according to the present invention, the surface of the semiconductor layer may be textured in order to lessen the reflection loss of incident light. In the case of silicon, hydrazine, NaOH or KOH is used therefor. Hills in the texture formed may preferably have a height in the range of from several μm to tens of μm.

How to form solar cells by working the process of the present invention will be described below in greater detail by giving Examples.

EXAMPLE 1

The present Example shows how to form a solar cell by transferring a single crystal silicon layer to a polyimide film according to the process shown in FIGS. 7A to 7G.

Figure 7A:
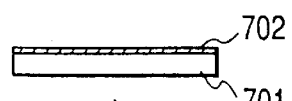
FIGS. 7A, 7B, 7C, 7D, 7E, 7F, 7G, 7H and 7I are a flow sheet diagrammatically illustrating a process for producing a semiconductor substrate carried out in Example 2.
Figure 7B:
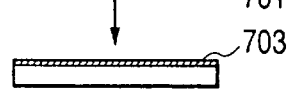
Figure 7C:
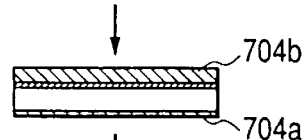

First, using $BCl_3$ as a thermal diffusion source and at a temperature of 1,200° C., B (boron) was thermally diffused into the surface portion of a single crystal silicon substrate 701 500 μm thick to form a $p^+$-type layer 702 about 3 μm thick (see FIG. 7A). Next, the surface of this substrate was anodized in an HF solution under conditions shown in Table 1 to form a porous silicon layer 703 on the substrate 701 (see FIG. 7B).

TABLE 1

| | |
|---|---|
| Anodizing solution: | $HF:H_2O:C_2H_5OH$ = 1:1:1 |
| Current density: | 5 mA/cm$^2$ |
| Anodizing time: | 2.5 minutes |

Next, the silicon substrate 701 on which the porous layer 703 had been formed was set in each fixing portion of the same substrate holder 401 as used in Experiment 3 and was annealed at 1,030° C. for 15 minutes in an atmosphere of hydrogen; thereafter, the temperature was dropped to 894° C. At the same time, metal indium was dissolved at 900° C. inside a carbon boat, and polycrystalline silicon wafer was melted into it while stirring the solution, until it became saturated. Thereafter, the temperature of the solution was slowly dropped to the same 894° C. as the silicon substrate 701 temperature. Thus a solution for liquid phase growth was prepared.

At the time the temperature of the solution became the same as that of the substrate, the stirring of the solution was stopped, and each substrate was immersed in the solution together with the substrate holder 401, followed by slow cooling at a cooling rate of −1.0° C./min. Thus, thin film silicon layers 704b and 704a were grown in a thickness of 30 μm thick on the surface of each porous layer 703 and in a thickness of 10 μm thick on the opposite side, respectively, and were thereafter drawn up (see FIG. 7C).

Figure 7D:
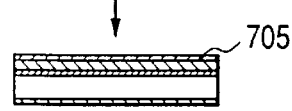
Figure 7E:
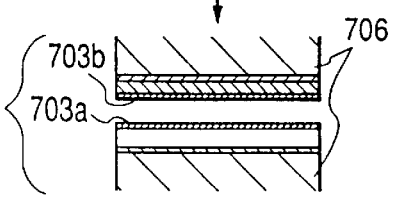
Figure 7F:
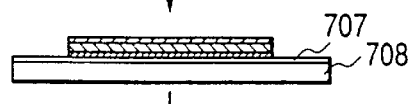
Figure 7G:
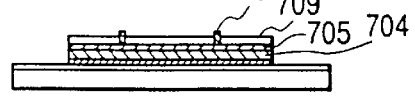

In a vapor phase growth chamber and by a vapor phase growth process making use of $POCl_3$, each substrate thus drawn up was heat-treated at 1,200° C. for 1 hour to cause P (phosphorus) to diffuse in the vicinity of the surface of the silicon layer 704b on the porous layer 703 to form an $n^+$-type layer 705 (see FIG. 7D). Simultaneously, because of the diffusion of B (boron) from the $p^+$-type porous layer 703, the vicinity of the porous layer of the silicon layer 704b was made into $p^+$-type. Here, a jig for covering the opposite side was attached so that $n^+$-type layer was formed only on the silicon layer on the porous layer side.

Next, using Teflon-processed jigs 706 having minute absorption holes, as a provisional substrate, the silicon substrate 701 was fixed at its both sides by means of a vacuum chuck, and a force was caused to act on the porous layer 703 to separate them into two parts. As the result, residues 703a and 703b of the porous layer were left on the silicon substrate 701 and on the thin film silicon layer 704b, respectively.

Instead of the jig 706, a tape as used in Experiment 1 may be used to fix the substrate at its both sides.

Figure 7H:
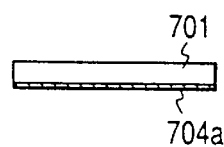

The junction-formed, thin film silicon layer 705 was stuck to a stainless steel substrate 708 coated with an aluminum paste 707, through the porous layer residue 703b, and then the vacuum chuck was released (see FIG. 7F), followed by baking at 300° C. Thereafter, on the surface of the $n^+$-type layer 705, a collector electrode 710 was printed using a copper paste, followed by baking at 500° C. Then, an ITO film 709 was deposited by means of a commercially available vacuum deposition apparatus (see FIG. 7G). As for the silicon substrate 701, after it was released from the vacuum chuck, its porous layer residue 703a was removed by etching (see FIG. 7H), and its surface was smoothed. Thereafter, using this substrate, the above process was repeated to produce substrates for solar cells.

In this way, thirty solar cell substrates were produced from one silicon substrate, but there was no change in the thickness of the silicon substrate on the whole and also no problem with process handling. I-V characteristics under irradiation by light of AM 1.5 (100 mW/cm²) were also measured. As a result, a photoelectric conversion efficiency of 14.8% on the average was achieved without any tendency of a decrease in the efficiency even with repetition of the process.

EXAMPLE 2

In the present Example, an instance is shown in which a silicon layer deposited by liquid phase growth on the side opposite to the porous layer 703 is used to dissolve silicon into a solution for liquid phase growth.

Figure 7I:
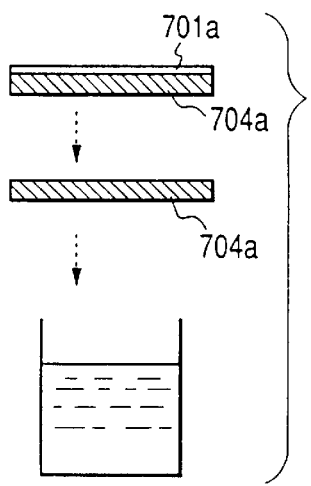

On a single crystal silicon substrate with a thickness of 800 μm, the FIG. 7A–7H process was carries out 75 times in entirely the same manner as in Example 1. As a result, it was possible to substantially use up the initial substrate without any process handling problem. A silicon substrate residue (denoted by reference numeral 701a) finally left as a result of the repetition of the above process was removed by etching, and thereafter the silicon layer 704a deposited in the liquid phase was dissolved into the indium solvent in order to prepare the solution for liquid phase growth (see FIG. 7I). Using the solution thus prepared, the FIG. 7A–7H process was parried out 30 times on a new silicon substrate, where no problem occurred at all with process handling.

For the thirty (30) solar cells thus obtained, I-V characteristics under irradiation by light of AM 1.5 (100 mW/cm) were also evaluated. As a result, a photoelectric conversion efficiency of 14.5% on the average was achieved without any particular problem.

EXAMPLE 3

Figure 8:
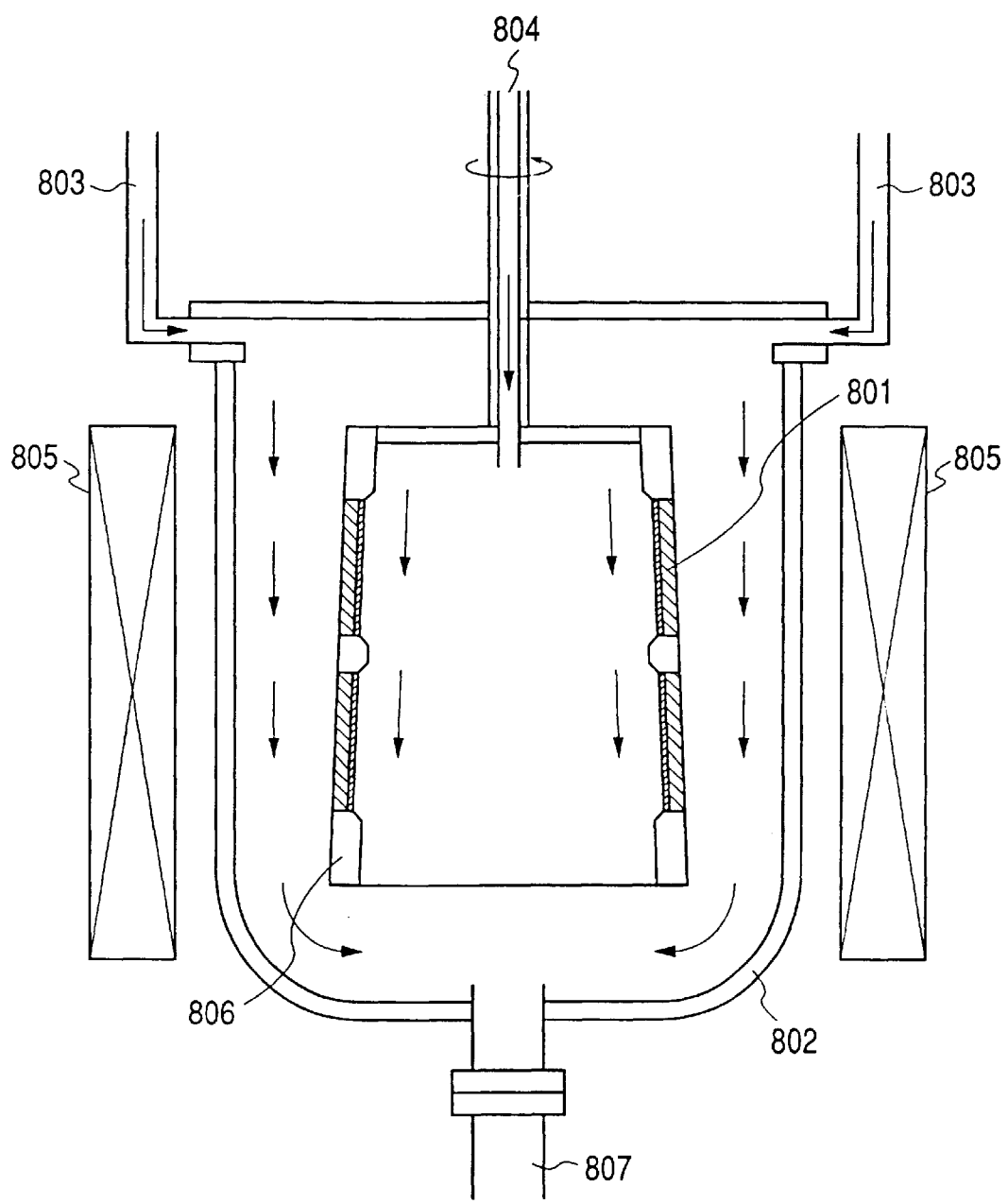
FIG. 8 is a schematic cross-sectional view diagrammatically illustrating a CVD apparatus used in Example 3.

In the present Example, an instance is shown in which the semiconductor layer is deposited by vapor phase growth to form solar cells. In the present Example, the porous layer was formed in a thickness of 10 μm on a silicon substrate (wafer) in the same manner as in Example 1, and thereafter the silicon layer was formed on the surface of the porous silicon layer by epitaxial growth using a CVD apparatus shown in FIG. 8. The following will be described with reference to FIG. 8.

First, silicon substrates 801 on the surfaces of which the porous layers had been formed were set on a barrel 806 with their porous layer sides inward and were sealed in a chamber 802. The barrel was rotated in the direction of an arrow shown in FIG. 8, and simultaneously hydrogen was flowed through gas introducing pipes 803 and 804 while heating with a heater 805 the silicon substrates 801 set on the barrel, where the silicon substrates 801 were annealed at 1,040° C. for 10 minutes. Incidentally, the gas introducing pipe 803 communicates with the outside of the barrel, and the gas introducing pipe 804 communicates with the inside of the barrel. Subsequently, films were formed under conditions shown in Table 2. Incidentally, the gas introduced into the chamber is forced out by the gas flowing in it and is exhausted through an exhaust pipe 807.

TABLE 2

| Ratio of gas flow rate: | |
| --- | --- |
| Barrel inside: | $Si_2Cl_2/H_2$ = 0.5/100 |
| Barrel outside: | $Si_2Cl_2/H_2$ = 0.5/300 |
|  | (L/min) |
| Substrate temperature: | 1,050° C. |
| pressure: | normal pressure |
| Growth time: | 30 minutes |

Here, in the course of growth, $B_2H_6$ was added in a trace quantity (1 ppm) to make the grown silicon layer into p-type, and also at the end of growth the quantity of $B_2H_6$ was increased (about hundreds of ppm) to form a $p^+$-type layer. The film on the porous layer was in a thickness of about 30 μm and that on the opposite side about 10 μm.

Next, on one side of a 50 um thick polyimide film, a copper paste was applied in a thickness of 20 μm by screen printing, and, with this side in contact, the film was bonded to a $p^+$-type silicon layer surface of each silicon substrate. In this state, the substrate with the film was put in an oven, and the copper paste was baked under conditions of 400° C. and 20 minutes to thereby fasten the polyimide film to the substrate.

After the substrate was kept fixed with a vacuum chuck on its side where no film was bonded, a force was caused to act from one end of the polyimide film on the fastened polyimide film and the substrate to carry out peeling. Thus, the silicon layer was peeled from the substrate and transferred onto the polyimide film.

The porous layer left on the silicon layer of the polyimide film peeled from the silicon substrate was selectively etched using a mixture solution of hydrofluoric acid, hydrogen peroxide solution and pure water with stirring. As the result, the silicon layer was minimally etched and only the porous layer was completely removed.

In the case of non-porous silicon single crystals, the above etching solution has such an extremely low etching rate thereon that its selection ratio to the etching rate on the porous layer reaches as great as 105 or more. Thus, the quantity of etching (about tens of angstroms) in the non-porous silicon single crystals is a quantity of the loss of layer thickness that is negligible in practical use.

The surface of the silicon layer on the resultant polyimide film was etched with a hydrofluoric acid/nitric acid type etchant to make it clean. Thereafter, an n-type μc-Si (microcrystalline silicon) layer was deposited on the silicon layer in a thickness of 200 angstroms by means of a conventional plasma enhanced CVD apparatus under conditions shown in Table 30.

TABLE 3

| Ratio of gas flow rate: | $SiH_4/H_2$ = 1 cc/2 cc |
| --- | --- |
| | $PH_3/SiH_4$ = 2.0 × 10$^{-3}$ |
| Substrate temperature: | 250° C. |
| Pressure: | 0.5 Torr |
| Discharge power: | 20 W |

Finally, on the pc-Si layer, a transparent conductive film (80 nm) formed of ITO and a collector electrode (Ti/Pd/Ag: 400 nm/200 nm/1 μm) were formed to form a solar cell.

The porous layer left on each silicon substrate after peeling was also removed by etching in the same manner as the above to make a smooth surface. Using regenerated substrates thus obtained, the above process was repeated 100 times. No particular problem occurred with process handling. I-V characteristics under irradiation by light of AM 1.5 (100 mW/cm$^2$) were measured on the thin film single crystal silicon solar cells thus obtained on polyimide. As a result, the solar cells showed a photoelectric conversion efficiency of 15.5$ on the average.

EXAMPLE 4

In the present Example, an n-type layer was deposited on the porous layer by vapor phase growth, and thereafter an active silicon layer was formed by liquid phase growth to form a solar cell.

First, on each of three single crystal silicon substrates 500 μm thick, a porous layer 10 μm thick was formed in the same manner as in Example 1. On the surface of the porous silicon layer, an n$^+$-type silicon layer was deposited in a thickness of 1 um by epitaxial growth using a conventional thermal CVD under conditions shown in Table 4.

TABLE 4

| Ratio of gas flow rate: | $SiH_4/H_2$ = 1 cc/20 cc |
| --- | --- |
| | $PH_3/SiH_4$ = 2.0 × 10$^{-3}$ |
| Substrate temperature: | 250° C. |
| Pressure: | 0.5 Torr |
| Discharge power: | 20 W |

Figure 9:
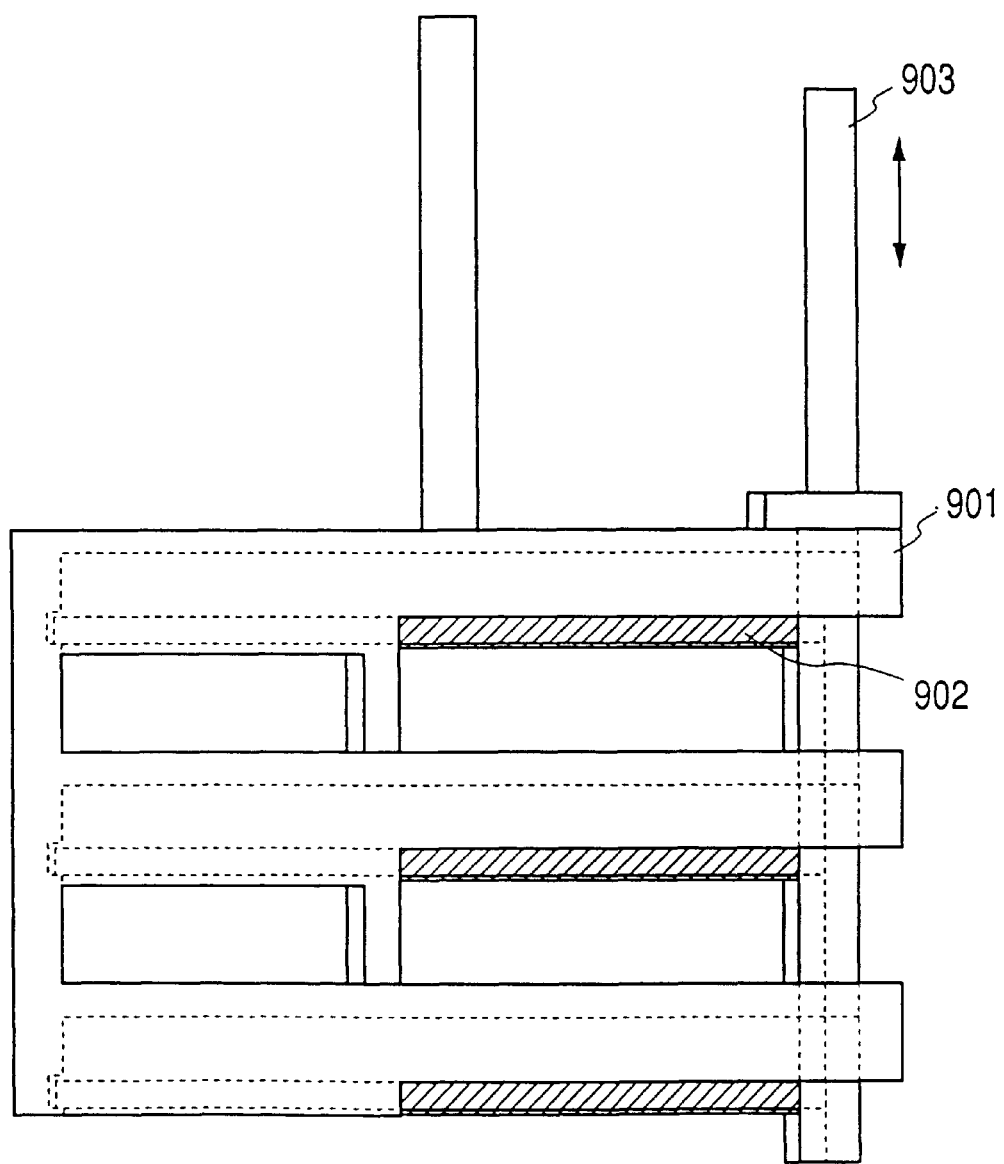
FIG. 9 is a schematic cross-sectional view diagrammatically illustrating a substrate holder for liquid phase growth used in Example 4.

Next, a solution for liquid phase growth was prepared in the same manner as in Example 1. The silicon substrates 902 on which the n$^+$-type layer had been formed were set on fixing portions of a substrate holder 901 as shown in FIG. 9, and silicon layers were grown in the following way: At the outset, only the surface of each substrate on its porous layer side was immersed in the liquid phase growth solution to make the silicon layer grow in a thickness of 10 μm. Thereafter, a draw rod 903 of the substrate holder was operated to immerse the both sides of each substrate in the solution, so that silicon layers were grown simultaneously on the both sides in a thickness of 10 μm. Namely, the silicon layer was deposited in a thickness of 20 μm on the surface of each porous layer and in a thickness of 10 μm on the opposite side, and then the resultant substrate was drawn up. Thus, when the layer thickness of the semiconductor layer is represented by E and the layer thickness of the porous layer by P, the silicon layers may be grown on the both sides after a silicon layer has been formed only on the porous layer in a thickness of E minus P (E–P).

Then, a stainless steel substrate coated with an aluminum paste 707 by printing was stuck to the silicon layer on the porous layer in close contact with it. In this state, these were put in an oven and were baked at 400° C. to simultaneously diffuse Al into the silicon layer to form a p-type layer. Thereafter, these were divided at the part of the porous layer to separate the silicon substrate from the stainless steel substrate.

After the porous residue left on the stainless steel substrate was removed, a collector electrode was printed on its surface using a silver paste, and a spray solution of TiO(NO$_2$)$_2$ was coated thereon, followed by baking at 400° C. to form a TiO$_2$ film of about 900 angstroms thick. As for the other silicon substrate, the porous residue left thereon was removed by etching to make a smooth surface. Thereafter, the process was repeated 100 times.

Thus, the process was repeated 100 times on each of the three single crystal silicon substrates. As a result, no problem occurred with process handling. I-V characteristics under irradiation by light of AM 1.5 were also evaluated on three hundred (300) solar cells. As a result, the solar cells showed a photoelectric conversion efficiency of 15.4% on the average.

EXAMPLE 5

In the present Example, on one side of a single crystal silicon substrate 500 μm thick, a porous layer 5 μm thick was formed in the same manner as in Example 1. On the surface of each porous silicon layer, a silicon layer was formed by liquid phase growth in the same manner as in Example 1 except that two single crystal silicon substrates were put together at their surfaces opposite to the porous layer sides and were fixed with a jig in the same manner as in Experiment 1, to form solar cells. This process was carried out five times on the same silicon substrate, and then, at the time of the sixth liquid phase growth, the substrates were set on a holder having an equal substrate distance, where the silicon layer was simultaneously grown on both sides of each substrate in a thickness of 30 μm.

More specifically, the layer thickness of the silicon substrate that decreased in one process (layer thickness of porous layer: P) was 5 μm, whereas the layer thickness E of the semiconductor layer deposited by liquid phase growth was 30 μm, and hence silicon layers of equally 30 μm thick were grown on the both sides only once in six times (30/5=6). Thus, it was possible to keep constant the layer thickness of the substrate. In this way, setting six processes as one cycle, the process was carried out on each of the two silicon substrates by 100 cycles to obtain one thousand two hundred (1,200) solar cells. Here, if E can not be divided by P, the same effect can be obtained also by growing the silicon layers on the both sides only once in the number of times given by rounding off the value of E/P.

From these solar cells, initial fifty (50) sheets and the last fifty (50) sheets were picked up for each substrate, and I-V characteristics under irradiation by light of AM 1.5 were also evaluated on these. As a result, the solar cells showed a photoelectric conversion efficiency of 14.90% on the average, without regard to the number of process times.

As having been described above, the present invention, in which semiconductor layers with good characteristics are formed on inexpensive substrates (the first substrate), can provide inexpensive semiconductor substrates and furthermore can provide inexpensive solar cells. Also, since the first substrate is regenerated and repeatedly used after the second substrate or provisional substrate is peeled from the first substrate, the present invention can make good use of materials. As the result, inexpensive semiconductor substrates and solar cells can be manufactured and can be supplied to the market.

What is claimed is:

1. A process for producing a semiconductor substrate, comprising the steps of:

a first step of anodizing a surface of a first substrate to form a porous layer on the surface;

a second step of simultaneously forming a semiconductor layer on the surface of the porous layer and a semiconductor layer on a surface of the first substrate on its side opposite to the porous layer side;

a third step of bonding the surface of the semiconductor layer formed on the surface of the porous layer, to a surface of a second substrate; and a fourth step of separating the first substrate and the second substrate at the part of the porous layer to transfer to the second substrate the semiconductor layer formed on the surface of the porous layer, thereby providing the semiconductor layer on the surface of the second substrate.

2. The process according to claim 1, which further comprises, after the fourth step, a fifth step of removing a residue of the porous layer, left on the surface of the first substrate as a result of the separation; the fifth step being followed by the first step to repeat the first to fifth steps to form semiconductor layers on the surfaces of a plurality of second substrates by use of the same first substrate.

3. The process according to claim 1, wherein in the second step a layer thickness of the semiconductor layer is controlled.

4. The process according to claim 3, wherein in the second step, when the layer thickness of the semiconductor layer formed on the surface of the porous layer is represented by E and the layer thickness of the porous layer by P, the semiconductor layers are simultaneously formed on the surface of the semiconductor layer and on the surface of the first substrate on its side opposite to the porous layer side after a semiconductor layer has been formed only on the porous layer in a thickness of E–P.

5. The process according to claim 3, wherein in the second step the semiconductor layer is formed in a liquid phase.

6. The process according to claim 5, wherein a plurality of first substrates are disposed in a liquid, appropriately setting mutual distances thereof, thereby controlling the layer thickness of the semiconductor layer formed on the surface of the porous layer and the layer thickness of the semiconductor layer formed on the surface of the first substrate on its side opposite to the porous layer side.

7. The process according to claim 2, wherein, after the first to fifth steps have been repeated, the semiconductor layers formed a plurality of times on the surface of the first substrate on its side opposite to the porous layer side are dissolved into a solvent so as to be reused.

8. The process according to claim 3, wherein in the second step the semiconductor layer is formed in a vapor phase.

9. The process according to claim 8, wherein in the second step a starting gas brought into contact with the surface of the porous layer and a starting gas brought into contact with the surface of the first substrate on its side opposite to the porous layer side are made different, thereby making different the layer thickness of the semiconductor layer formed on the surface of the porous layer and the layer thickness of the semiconductor layer formed on the surface of the first substrate on its side opposite to the porous layer side.

10. A process for producing a semiconductor substrate, comprising:

a first routine comprising a first step of anodizing a surface of a first substrate to form a porous layer on the surface; a second step of simultaneously forming a semiconductor layer on the surface of the porous layer and a semiconductor layer on a surface of the first substrate on its side opposite to the porous layer side; a third step of bonding the surface of the semiconductor layer formed on the surface of the porous layer, to a surface of a second substrate; a fourth step of separating the first substrate and the second substrate at the part of the porous layer to transfer to the second substrate the semiconductor layer formed on the surface of the porous layer; and a fifth step of removing a residue of the porous layer, left on the surface of the first substrate as a result of the separation; and a second routine comprising a first step of anodizing a surface of a first substrate to form a porous layer on the surface; a second step of forming a semiconductor layer only on the surface of the porous layer; a third step of bonding the surface of the semiconductor layer formed on the surface of the porous layer, to a surface of a second substrate; a fourth step of separating the first substrate and the second substrate at the part of the porous layer to transfer to the second substrate the semiconductor layer formed on the surface of the porous layer; and a fifth step of removing a residue of the porous layer left on the surface of the first substrate as a result of the separation;

the first and second routines being repeated at least once to provide the semiconductor layers on the surfaces of a plurality of second substrates by use of the same first substrate.

11. The process according to claim 10, wherein in the second step, when the layer thickness of the semiconductor layer formed on the surface of the porous layer is represented by E and the layer thickness of the porous layer by P, the ratio of the number of times to carry out the first routine to the number of times to carry out the second routine is so controlled as to be P:(E–P).

12. A process for producing a semiconductor substrate, comprising the steps of:

a first step of anodizing a surface of a first substrate to form a porous layer on the surface;

a second step of simultaneously forming a semiconductor layer on the surface of the porous layer and a semiconductor layer on a surface of the first substrate on its side opposite to the porous layer side;

a third step of fixing the surface of the semiconductor layer formed on the surface of the porous layer and a surface of a provisional substrate;

a fourth step of separating the first substrate and the semiconductor layer formed on the surface of the porous layer at the part of the porous layer to make the provisional substrate hold the semiconductor layer formed on the surface of the porous layer; and a fifth step of transferring from the provisional substrate to a second substrate the semiconductor layer held on the provisional substrate, thereby providing the semiconductor layer on the surface of the second substrate.

13. The process according to claim 12, which further comprises, after the fifth step, a sixth step of removing a residue of the porous layer, left on the surface of the first substrate as a result of the separation; the sixth step being followed by the first step to repeat the first to sixth steps to form semiconductor layers on the surfaces of a plurality of second substrates by use of the same first substrate.

14. The process according to claim 12, wherein in the second step the layer thickness of the semiconductor layer is controlled.

15. The process according to claim 14, wherein in the second step, when the layer thickness of the semiconductor layer formed on the surface of the porous layer is represented by E and the layer thickness of the porous layer by P, the semiconductor layers are simultaneously formed on the surface of the semiconductor layer and on the surface of the first substrate on its side opposite to the porous layer side after a semiconductor layer has been formed only on the porous layer in a thickness of E−P.

16. The process according to claim 14, wherein in the second step the semiconductor layer is formed in a liquid phase.

17. The process according to claim 16, wherein a plurality of first substrates are disposed in a liquid, appropriately setting mutual distances thereof, thereby controlling the layer thickness of the semiconductor layer formed on the surface of the porous layer and the layer thickness of the semiconductor layer formed on the surface of the first substrate on its side opposite to the porous layer side.

18. The process according to claim 13, wherein, after the first to sixth steps have been repeated, the semiconductor layers formed a plurality of times on the surface of the first substrate on its side opposite to the porous layer side are dissolved into a solvent so as to be reused.

19. The process according to claim 14, wherein in the second step the semiconductor layer is formed in a vapor phase.

20. The process according to claim 19, wherein in the second step a starting gas brought into contact with the surface of the porous layer and a starting gas brought into contact with the surface of the first substrate on its side opposite to the porous layer side are made different, thereby making different the layer thickness of the semiconductor layer formed on the surface of the porous layer and the layer thickness of the semiconductor layer formed on the surface of the first substrate on its side opposite to the porous layer side.

21. A process for producing a semiconductor substrate, comprising:

a first routine comprising a first step of anodizing a surface of a first substrate to form a porous layer on the surface; a second step of simultaneously forming a semiconductor layer on the surface of the porous layer and a semiconductor layer on a surface of the first substrate on its side opposite to the porous layer side; a third step of fixing the surface of the semiconductor layer formed on the surface of the porous layer and a surface of a provisional substrate; a fourth step of separating the first substrate and the semiconductor layer formed on the surface of the porous layer at the part of the porous layer to make the provisional substrate hold the semiconductor layer formed on the surface of the porous layer; a fifth step of transferring from the provisional substrate to a second substrate the semiconductor layer held on the provisional substrate; and a sixth step of removing a residue of the porous layer, left on the surface of the first substrate as a result of the separation; and a second routine comprising a first step of anodizing a surface of a first substrate to form a porous layer on the surface; a second step of forming a semiconductor layer only on the surface of the porous layer; a third step of fixing the surface of the semiconductor layer formed on the surface of the porous layer and a surface of a provisional substrate; a fourth step of separating the first substrate and the semiconductor layer formed on the surface of the porous layer at the part of the porous layer to make the provisional substrate hold the semiconductor layer formed on the surface of the porous layer; a fifth step of transferring from the provisional substrate to a second substrate the semiconductor layer held on the provisional substrate; and a sixth step of removing a residue of the porous layer, left on the surface of the first substrate as a result of the separation; the first and second routines being repeated at least once to provide the semiconductor layers on the surfaces of a plurality of second substrates by use of the same first substrate.

22. The process according to claim 21, wherein in the second step, when the layer thickness of the semiconductor layer formed on the surface of the porous layer is represented by E and the layer thickness of the porous layer by P, the ratio of the number of times to carry out the first routine to the number of times to carry out the second routine is so controlled as to be $P:(E-P)$.

* * * * *

UNITED STATES PATENT AND TRADEMARK OFFICE
CERTIFICATE OF CORRECTION

PATENT NO. : 6,258,698 B1
DATED : July 10, 2001
INVENTOR(S) : Yukiko Iwasaki et al.

It is certified that error appears in the above-identified patent and that said Letters Patent is hereby corrected as shown below:

Column 2,
Line 18, "is" should be deleted;
Line 58, "side:" should read -- side; --.

Column 4,
Line 12, "layer-formed" should read -- layer formed --; and
Line 64, "wafer s" should read -- wafer as --.

Column 5,
Line 26, "p'-type (or n'-type) should read -- $p^+$-type (or $n^+$-type) --.

Column 6,
Line 24, "50$" should read -- 50% --.

Column 8,
Line 7, "etc." should read -- etc., --.

Column 9,
Line 49, "30" should be deleted.

Column 11,
Line 9, "porous layer of the" should read -- thin film --;
Line 14, "holes," should read -- holes --;
Line 24, "layer 705" should read -- layer 704b --;
Line 53, "carries" should read -- carried --;
Line 64, "parried" should read -- carried --; and
Line 67, "(100 mW/cm)" should read -- (100 mW/cm$^2$) --.

UNITED STATES PATENT AND TRADEMARK OFFICE
CERTIFICATE OF CORRECTION

PATENT NO. : 6,258,698 B1
DATED : July 10, 2001
INVENTOR(S) : Yukiko Iwasaki et al.

It is certified that error appears in the above-identified patent and that said Letters Patent is hereby corrected as shown below:

Column 12,
Line 47, "50 um" should read -- 50 µm --.

Column 13,
Line 23, "pc-Si" should read -- µc-Si --;
Line 35, "15.5$" should read -- 15.5% --; and
Line 46, "1 um" should read -- 1 µm --.

Column 18,
Line 39, "the" should read -- ¶ the --.

Signed and Sealed this

Twelfth Day of March, 2002

JAMES E. ROGAN
Director of the United States Patent and Trademark Office